(12) United States Patent
Christenson (10) Patent No.: US 7,294,552 B2
(45) Date of Patent: Nov. 13, 2007

(54) ELECTRICAL CONTACT FOR A MEMS DEVICE AND METHOD OF MAKING

(75) Inventor: John C. Christenson, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 121 days.

(21) Appl. No.: 11/214,380

(22) Filed: Aug. 29, 2005

(65) Prior Publication Data

US 2007/0048888 A1    Mar. 1, 2007

(51) Int. Cl.
*H01L 21/331* (2006.01)
*H01L 21/8222* (2006.01)

(52) U.S. Cl. .................. 438/311; 438/270; 438/700; 438/42; 257/E21.32; 257/E21.218; 257/E21.229; 257/E21.245

(58) Field of Classification Search ............... 438/311, 438/270, 700, 42, 43, 44, 706, 712, 657, 438/663, 673, 753
See application file for complete search history.

(56) References Cited

U.S. PATENT DOCUMENTS

| | | | |
|---|---|---|---|
| 5,383,362 A | 1/1995 | Putty et al. | |
| 5,450,751 A | 9/1995 | Putty et al. | |
| 5,616,864 A | 4/1997 | Johnson et al. | |
| 5,652,374 A | 7/1997 | Chia et al. | |
| 5,866,796 A | 2/1999 | Chia et al. | |
| 5,872,313 A | 2/1999 | Zarabadi et al. | |
| 6,128,954 A | 10/2000 | Jiang | |
| 6,282,958 B1 | 9/2001 | Fell et al. | |
| 6,305,222 B1 | 10/2001 | Johnson et al. | |
| 6,806,111 B1 * | 10/2004 | Ehrichs et al. | 438/29 |
| 6,855,992 B2 * | 2/2005 | Emrick et al. | 257/378 |
| 2003/0015707 A1 * | 1/2003 | Bosco et al. | 257/73 |

* cited by examiner

*Primary Examiner*—David Nhu
(74) *Attorney, Agent, or Firm*—Jimmy L. Funke (57) ABSTRACT

A method for making a subsurface electrical contact on a micro-electrical-mechanical-systems (MEMS) device. The contact is formed by depositing a layer of polycrystalline silicon onto a surface within a cavity buried under a device silicon layer. The polycrystalline silicon layer is deposited in the cavity through holes etched through the device silicon and reseals the cavity during the polycrystalline silicon deposition step. The polycrystalline silicon layer can then be masked and etched, or etched back to expose the device layer of the micromachined device. Through the layer of polycrystalline silicon, a center hub of the device may be electrically contacted.

9 Claims, 11 Drawing Sheets

ELECTRICAL CONTACT FOR A MEMS DEVICE AND METHOD OF MAKING

TECHNICAL FIELD

The present invention generally relates to micro-electro-mechanical systems (MEMS) devices and, more particularly, to the fabrication of a MEMS device having a subsurface electrical contact.

BACKGROUND OF THE INVENTION

Angular rate sensors, also referred to as yaw sensors, typically include vibrating structure gyroscopes in various configurations including beams, tuning forks, cylinders, hemispherical shells and rings. The vibrating structures typically operate by taking advantage of the Coriolis effect. Yaw sensors, as well as accelerometers and other devices are increasingly being formed as micro-electro-mechanical-systems (MEMS) devices which achieve reduced size and cost.

Conventional MEMS sensors are typically made of silicon. All-silicon ring type yaw sensors have been shown to exhibit some advantages over other yaw sensor configurations. However, many such devices suffer from a fundamental problem involving how to make electrical contact with the center hub of the device, from which the resonating ring is attached and suspended.

Several solutions exist to electrically contact the center hub of the all-silicon device. One approach employs wire bonds attached directly to the center hub as disclosed in U.S. Pat. No. 6,282,958, which is hereby incorporated herein by reference. The wire bond design has several drawbacks. A misplaced wire bond may crush the springs upon which the resonating ring is suspended and render the sensor inoperable. Additionally, a wire bond made with excessive force may crush the center hub and render the sensor inoperable. Further, wire may act as an antenna and pick up undesirable stray capacitance which may be modulated by movement of the wire.

It is generally known that an all-silicon ring may be formed over a cavity that has been previously formed within a substrate. The ring and supporting springs of the MEMS structure are freed by masking the springs and then etching through the silicon device layer into the cavity, thus releasing the resonating portion of the structure. Conventional methods for forming a MEMS subsurface cavity involves bonding a wafer, that has had the cavity formed in its surface, to another wafer, and then thinning the second wafer to the desired ring structure thickness. Conventional processing of the silicon surface, beyond creating a cavity, then growing an oxide layer on that surface, generally makes the yield at the wafer bond unacceptably low. Thus, conventional yaw sensors made over a buried cavity generally do not have center hub contact runners patterned down into them, as the bond yield may be too low to produce a commercially viable sensor.

Conventional silicon ring sensors typically employ a central support hub and support beams to support the ring resonator over a cavity. The sensor also includes sense and drive electrodes which are electrically coupled to the ring resonator. A change in capacitive coupling is measured which is indicative of the sensed yaw. In manufacturing the yaw sensor, it is generally difficult to provide the proper electrical coupling to the resonator ring.

These and other drawbacks make a conventional all-silicon MEMS yaw sensor difficult to fabricate, package, electrically compensate for and pull electrical signals out of. Compensating for these and other difficulties generally make a MEMS yaw sensor more costly. It is therefore desirable to provide for a method of forming a low cost silicon MEMS device, such as a yaw sensor, that has an easy to form electrical contact. It is further desirable to provide for a MEMS device that may be formed with topside processing, in an established high volume, low cost production environment.

SUMMARY OF THE INVENTION

According to one aspect of the present invention, a method of making an electrical contact for a micro-electro-mechanical systems (MEMS) device is provided. The method includes the steps of providing a silicon device layer supported on a substrate over a cavity in the substrate, and providing a dielectric layer on a surface of the cavity. The method also includes the step of forming a via extending through the device layer to allow access to the cavity. The method further includes the step of depositing polycrystalline silicon extending into the via and onto the dielectric layer in the cavity. Further, the method includes the step of providing electrical contact to the polycrystalline silicon such that electrical signals are able to be conducted on the polycrystalline silicon.

According to another aspect of the present invention, a MEMS device is provided having a subsurface electrical contact. The device includes a substrate having a cavity formed therein, a device layer provided on top of the substrate and having an opening leading to the cavity, and a dielectric layer formed on the top surface of the cavity. The device also includes a polycrystalline silicon layer extending through the opening into the cavity and on top of the dielectric layer. The device further includes a pair of electrical contacts coupled to first and second portions of the polycrystalline silicon to allow for electrical signal communication on the polycrystalline silicon.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

A method of making a center hub electrical contact on a MEMS device and the resultant MEMS device are shown and described herein according to exemplary embodiments. The method and resultant electrical contact are useful for, but not limited to, the exemplary silicon yaw sensor disclosed. The method and resultant MEMS device is cost-effective, does not suffer from plating problems, and can be easily integrated into an existing high volume manufacturing process. Additionally, the resultant MEMS device does not require a wire bond to the center hub, does not require a data line into the center hub which may break the symmetry of the movable structure, and does not suffer from modulated stray electrical signals or capacitance. Further, the device does not cause perturbations in the ring or spring symmetry, height, or shape, does not adversely affect the bond yield of a buried cavity-containing substrate, can be properly and easily isolated from the drive and sense electrodes, and can be made to pass electrical signals at an advantageous frequency.

The method of making the MEMS device is a modular process that can be integrated into an existing low cost, high volume production process. The center hub electrical contact is generally formed by depositing a conformal coat of polycrystalline silicon onto the surfaces of the device, including the surfaces within a cavity buried under the device silicon layer. The polycrystalline silicon is deposited within the cavity through holes etched preferentially through the device silicon into the cavity prior to the polycrystalline silicon deposition. The polycrystalline silicon then reseals the cavity during the polycrystalline silicon deposition step. The polycrystalline silicon can then be masked and etched to form desired patterns of electrical conductors on the top surface, or etched back, to expose the device layers of the MEMS micromachined device.

In one exemplary embodiment, the center hub of the MEMS device may be electrically contacted through this layer of polycrystalline silicon. The center hub contact is electrically isolated from the substrate and the portions of the device silicon layer that form the drive and sense electrodes, as well as other features of the device. The center hub electrical contact may be trench isolated during the same etch step that trench isolates the other electrical structures and delineates and releases the moving portions of the micromachined MEMS device.

The exemplary MEMS device in the form of a yaw sensor 10 and the method of making the MEMS yaw sensor 10 are illustrated in FIGS. 1-16, according to a first embodiment. While the MEMS device 10 and method are illustrated herein in accordance with a yaw sensor, it should be appreciated that the method and resultant MEMS device 10 may be applicable to other MEMS devices, such as accelerometers. In particular, the MEMS device 10 and method of manufacturing include the formation of an electrical contact formed subsurface in a cavity buried under the device silicon layer to form an electrical signal path. The process module for forming the center hub electrical contact may be embedded within an existing low cost, high volume MEMS fabrication process that may be used to form a MEMS device.

Figure 1:
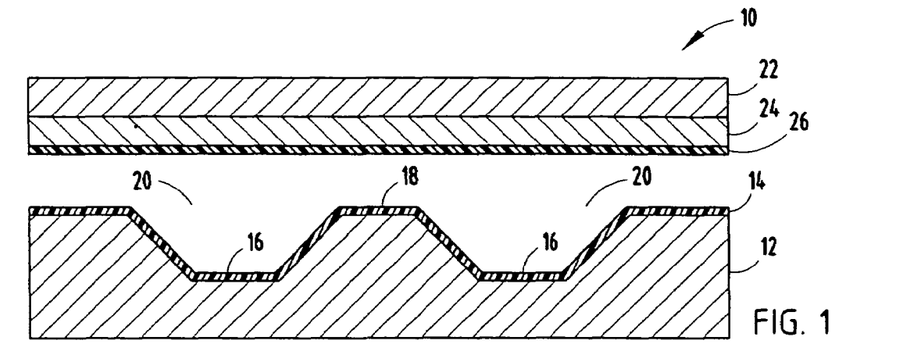
FIG. 1 is a cross-sectional view of two substrates for forming a MEMS device according to a first embodiment the present invention.

Referring initially to FIG. 1, a step of connecting a silicon handle wafer substrate 12 to an epitaxial device layer 24 is shown prior to formation of the center hub electrical contact. A recessed cavity surface 16 is formed within the silicon substrate 12. The cavity may be formed by an etch process as is known in the art in which the recessed cavity surface 16 is formed. Alternately, the cavity may be formed by other processes such as Silicon-On-Insulator (SOI), bond and grind and polish, Smart-cut, etc., prior to forming the oxide layer 14. Next, an oxide layer 14 is formed to line the upper surface of substrate 12 including the cavity surface 16. Oxide layer 14 is a dielectric layer.

The epitaxial device layer 24 is initially formed upon a surface of a sacrificial silicon wafer 22. An oxide layer 26 is formed to line the surface of the epitaxial device layer 24. Accordingly, both the cavity-containing handle substrate 12 and the epitaxial device layer 24 have respective oxide layers 14 and 26 formed upon their surfaces prior to bonding together.

Figure 2:
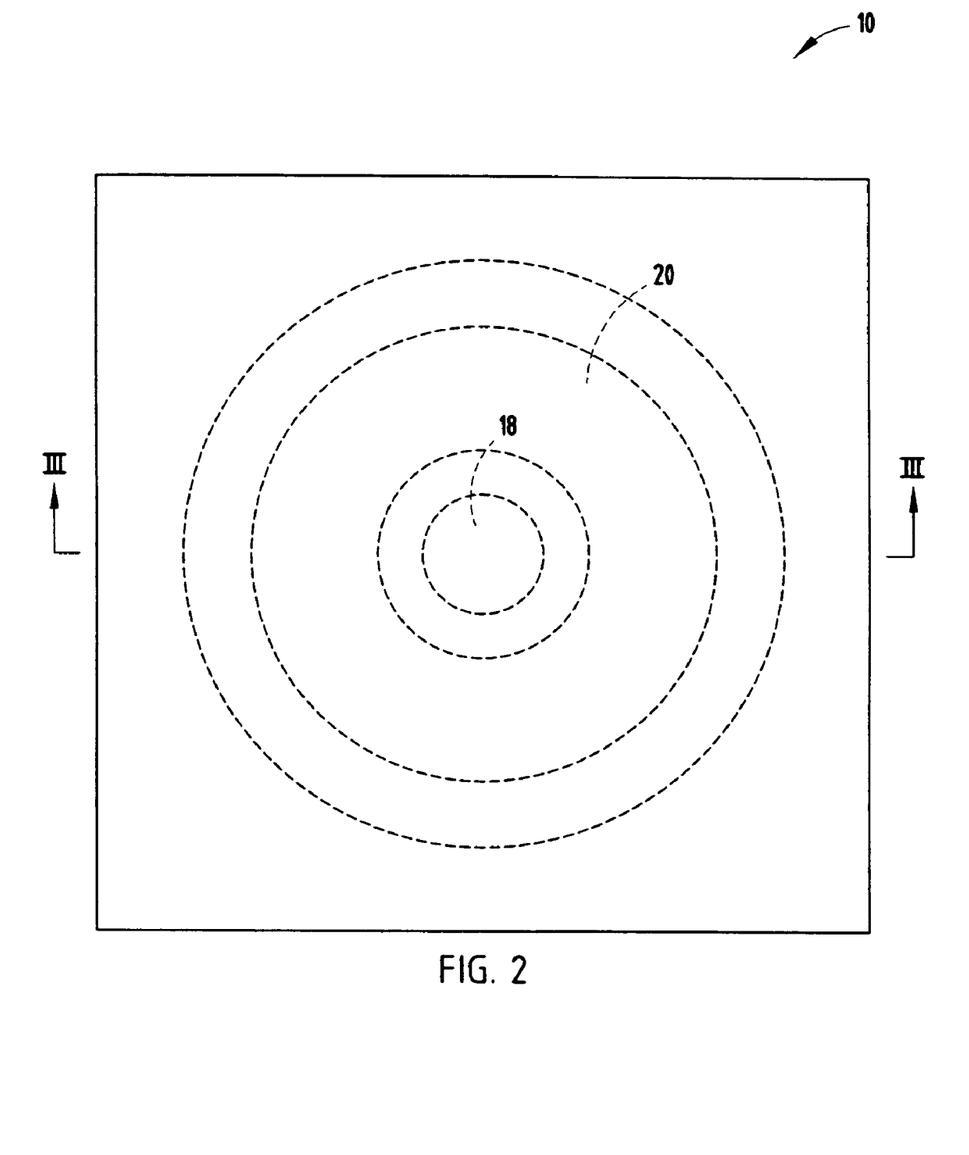
FIG. 2 is a top view of the substrates of FIG. 1 assembled to form the MEMS device during fabrication.
Figure 3:
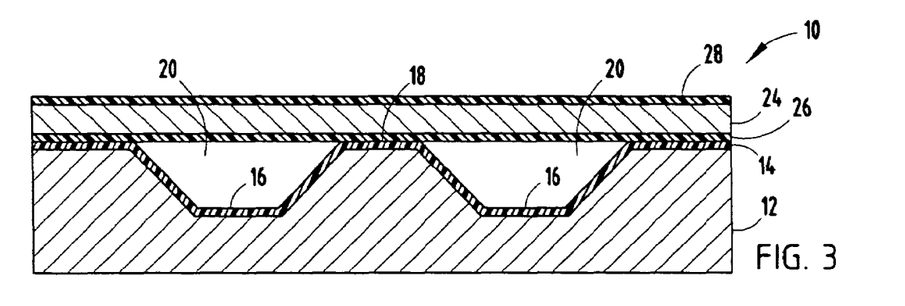
FIG. 3 is a cross-sectional view of the MEMS device taken through lines III-III of FIG. 2.

Referring to FIGS. 2 and 3, the two substrate structures are bonded together via oxide layers 14 and 26. The overlying device layer 24 and recessed cavity surface 16 define a cavity 20 that, in the embodiment shown, is generally ring shaped with an upstanding hub 18 formed in the center. The sacrificial silicon substrate 22 overlying epitaxial silicon device layer 24 is then removed such as by etching. Once the sacrificial substrate 22 has been removed, a layer of oxide 28 or other insulating film is formed on the top surface of the device layer 24.

Figure 4:
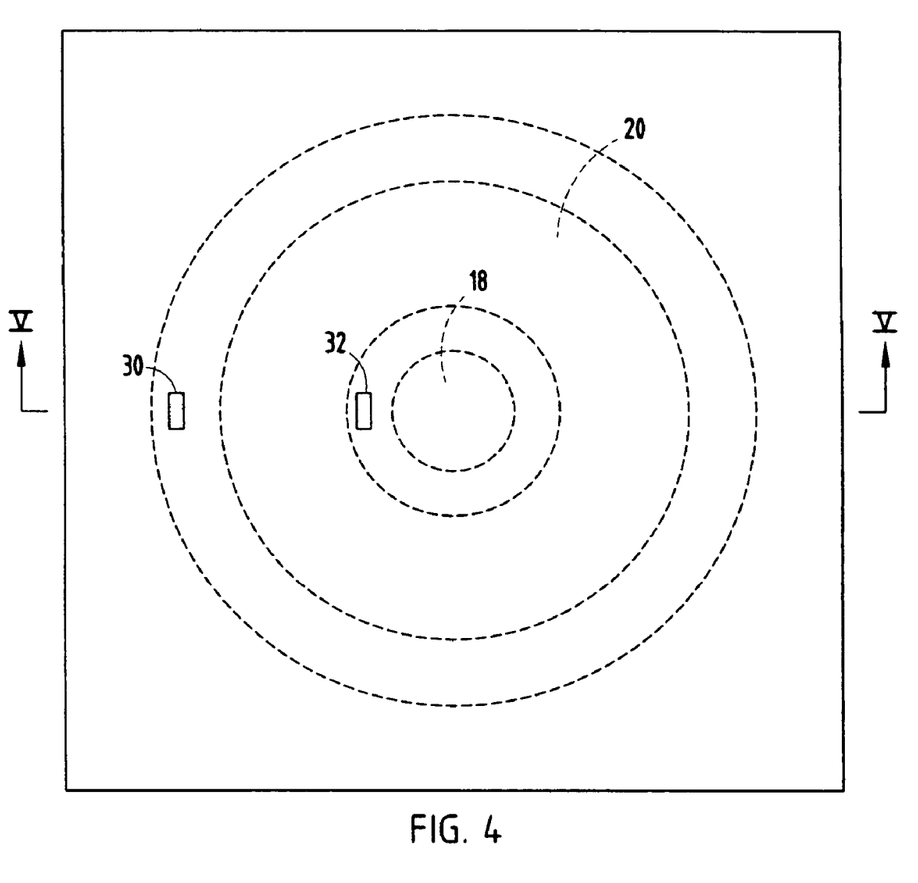
FIG. 4 is a top view of the MEMS device further during fabrication.
Figure 5:
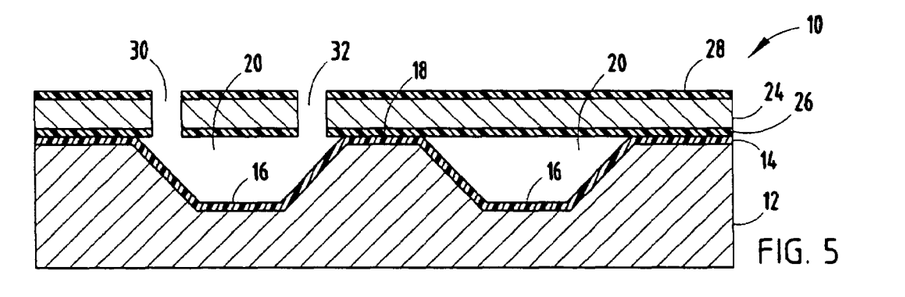
FIG. 5 is a cross-sectional view of the MEMS device taken through lines V-V of FIG. 4.

Referring to FIGS. 4 and 5, the oxide layer 28 is patterned to expose the epitaxial silicon device layer 24. Next, vias (holes) 30 and 32 are formed in the device layer 24 and the oxide layer 26 over the cavity 20, as is known in the industry. According to one embodiment, a silicon etch step may be performed with a deep reactive ion etch (DRIE) tool so that small, high aspect ratio holes 30 and 32 with vertical sidewalls may be formed. The oxide lining of the cavity may then be dry-etched after the silicon etch. Thus, vias 30 and 32 are formed between the top surface of the device layer 24 and its oxide layers 26 and 28 and the underlying cavity 20 to expose the cavity 20.

Figure 6:
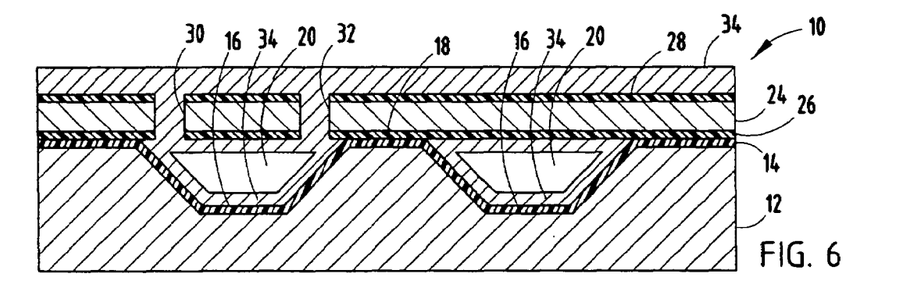
FIG. 6 is a cross-sectional of the MEMS device further illustrating the deposition of polycrystalline silicon.

Once the vias (holes) 30 and 32 are formed, polycrystalline silicon 34 is deposited onto the surfaces of the device as shown in FIG. 6. Because a polycrystalline silicon deposition process results in a very conformal coating of polycrystalline silicon, the inside surface of the cavity 20 beneath the device silicon layer 24 is coated uniformly with polycrystalline silicon 34, according to one embodiment. According to one embodiment, an in-situ doped polycrystalline silicon may be employed. Polycrystalline silicon 34 can be doped in-situ during the deposition.

The small holes 30 and 32 through which the polycrystalline silicon 34 is deposited are preferentially sized so that the thickness of the polycrystalline silicon 34 is at least larger than one-half of the width of the holes 30 and 32. This results in the polycrystalline silicon 34 closing off the holes 30 and 32 by completely plugging the holes 30 and 32 during the deposition step. It should be noted that the resulting polycrystalline silicon plugs 34 in holes 30 and 32 are not removed and form an integral portion of the device layer 24. Thus, the cavity 20 is hermetically sealed. Further, since these polycrystalline silicon hole plugs are made of silicon, there is little or no difference in thermal coefficients of expansion (CTE) between the polycrystalline silicon plugs and the rest of the device silicon layer 24.

Figure 7:
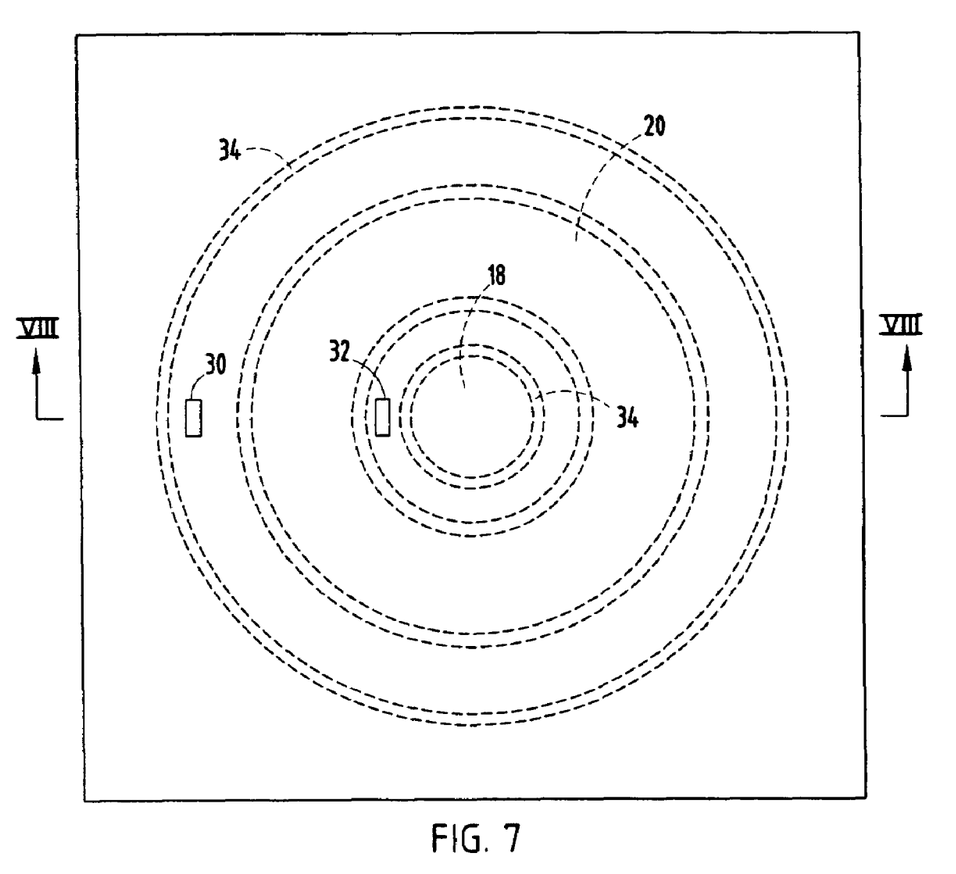
FIG. 7 is a top view of the MEMS device further during fabrication.
Figure 8:
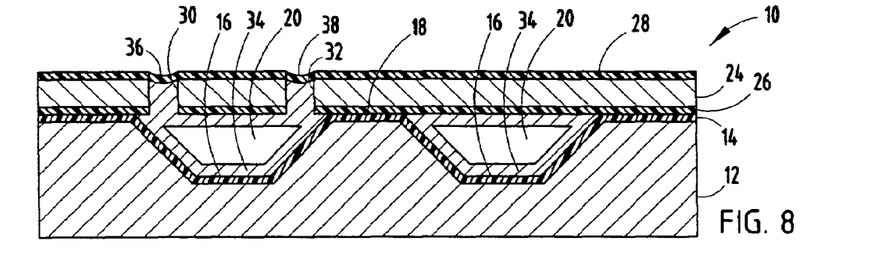
FIG. 8 is a cross-sectional view of the MEMS device taken through lines VIII-VIII of FIG. 7.

Next, the coating (e.g., film) of polycrystalline silicon 34 on top of oxide layer 28 is removed as seen in FIGS. 7 and 8. This may be achieved by etching the polycrystalline silicon 34 entirely off the top surface of the device silicon layer 24. Should additional polycrystalline silicon features such as runners (not shown) be advantageous, such features may be formed by masking the polycrystalline silicon 34 prior to the polycrystalline silicon etch, then selectively removing the unmasked portion of the polycrystalline silicon from the surface. The polycrystalline silicon etch is selective to the underlying oxide film 28, so an automated etch stop process, as is known in the industry, may be employed to etch the polycrystalline silicon 34. It may be further desirable to oxidize the polycrystalline silicon after it has been etched, depending on the MEMS device that is being made to form oxidized plugs 36 and 38.

The coating of polycrystalline silicon 34 within vias 30 and 32 and cavity 20 serves to provide an electrically conductive signal transmission medium. The polycrystalline silicon 34 deposed on the bottom surface of cavity 20 provides an electrical signal path that extends below the surface of the device silicon layer 24 to form a subsurface electrical contact. The electrical contact enables signals to be transmitted to and from a region near the central hub 18.

Figure 9:
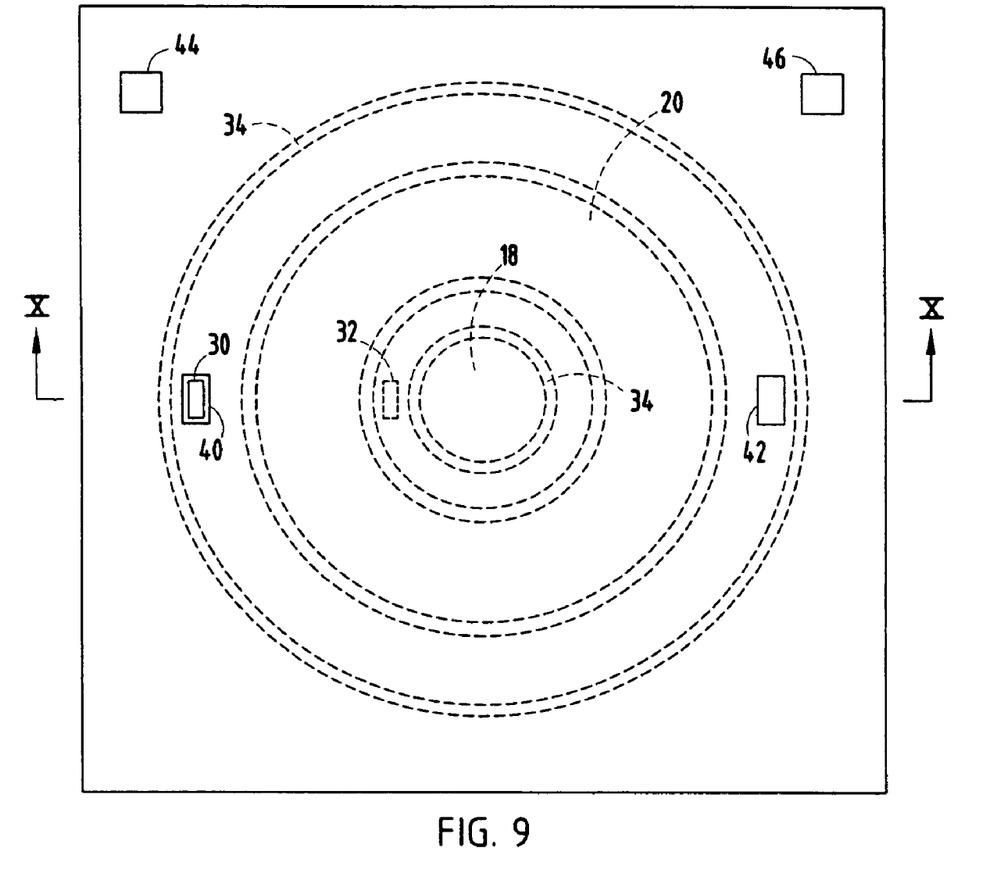
FIG. 9 is a top view of the MEMS device further during fabrication.
Figure 10:
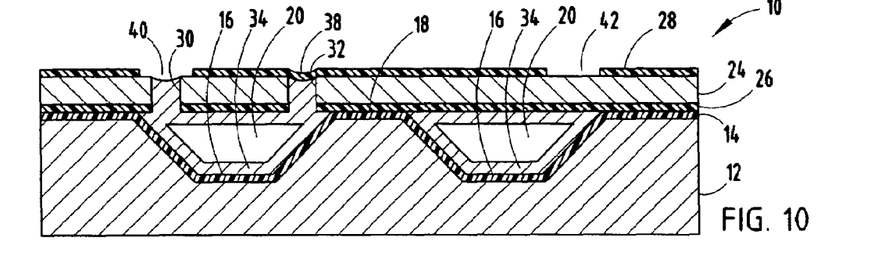
FIG. 10 is a cross-sectional view of the MEMS device taken through lines X-X of FIG. 9.
Figure 11:
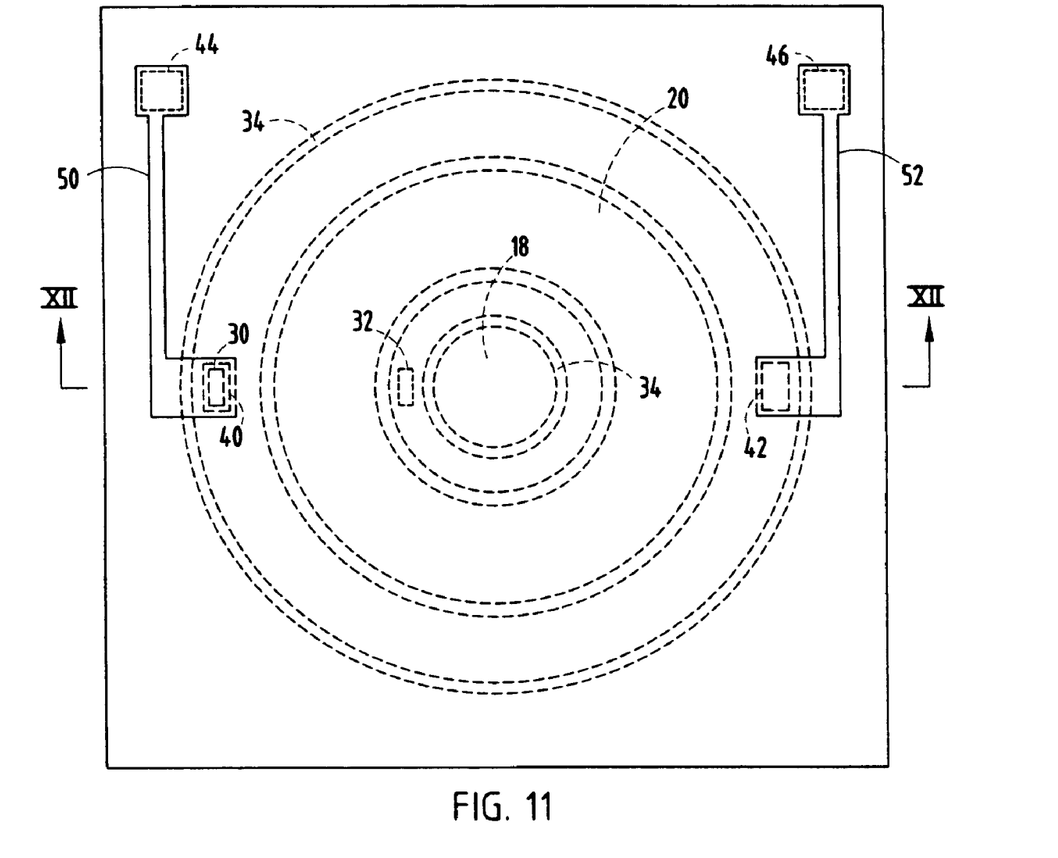
FIG. 11 is a top view of the MEMS device further during fabrication.
Figure 12:
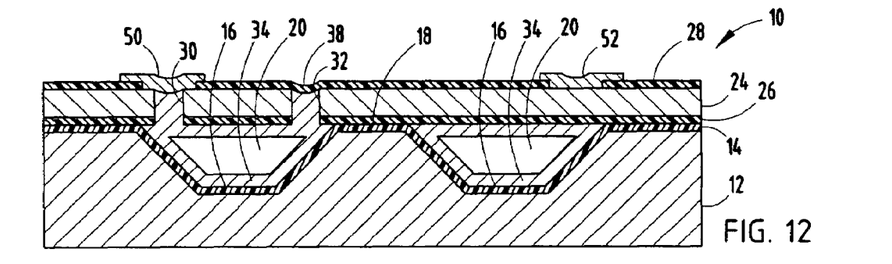
FIG. 12 is a cross-sectional view of the MEMS device taken through lines XII-XII of FIG. 11.
Figure 13:
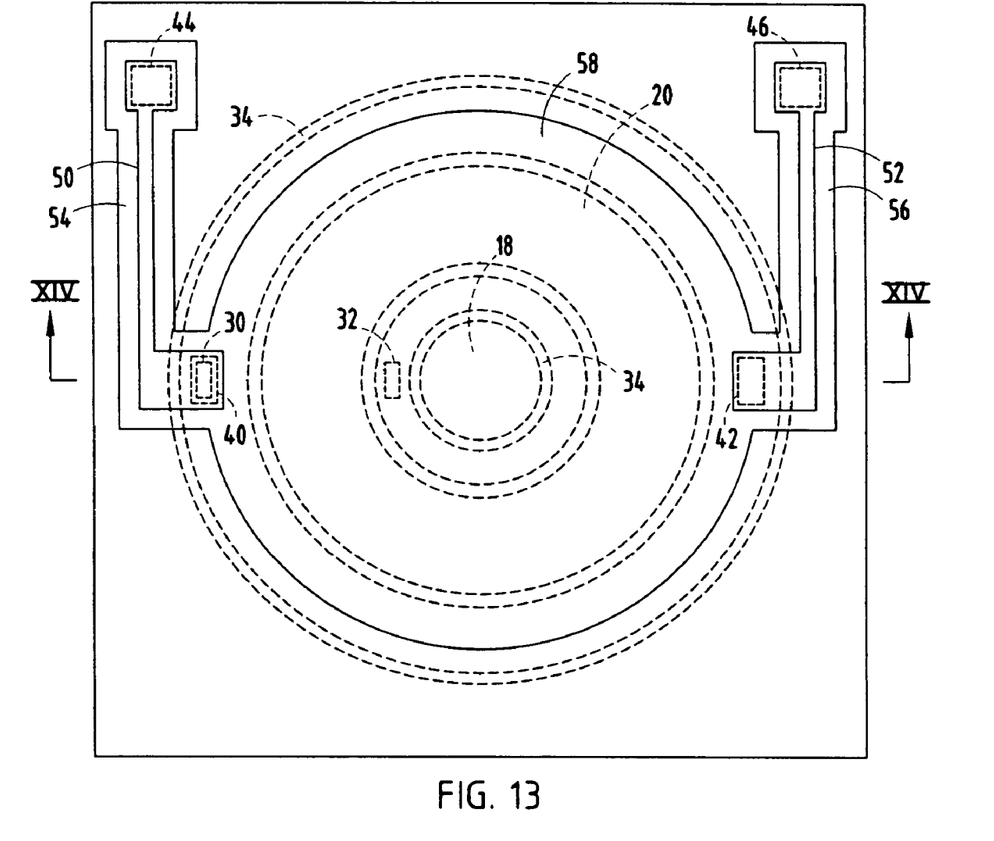
FIG. 13 is a top view of the MEMS device further during fabrication.
Figure 14:
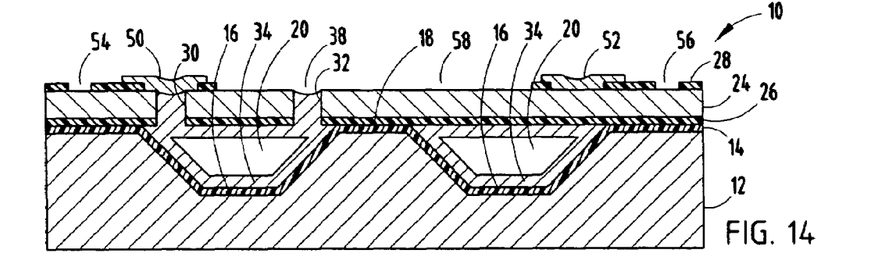
FIG. 14 is a cross-sectional view of the MEMS device taken through lines XIV-XIV of FIG. 13.

The fabrication of the subsurface electrical contact on the MEMS device 10 is finished by forming electrical contact terminals in contact with the polycrystalline silicon 34. Formation of the contact terminals includes the step of forming electrical contact regions 40, 42, 44 and 46 in the oxide layer 28 to expose the epitaxial device layer 24 and/or polycrystalline silicon plug 36, as seen in FIGS. 9 and 10. Next, formation of the contact terminals includes the step of depositing and patterning metal 50 and 52 in the respective contact regions 40 and 42 in contact with the polycrystalline silicon 34, and device layer 24, respectively, as seen in FIGS. 11 and 12. The patterned metal 50 and 52 may lead to contact pads that allow further signal communication (e.g., inputs, outputs). Additionally, the metal and other surfaces of the device may be passivated, if desired (not shown). Areas 54, 56 and 58 of the device silicon layer 24 are opened through the passivation (if any) and the oxide layer 28, as shown in FIGS. 13 and 14.

Figure 15:
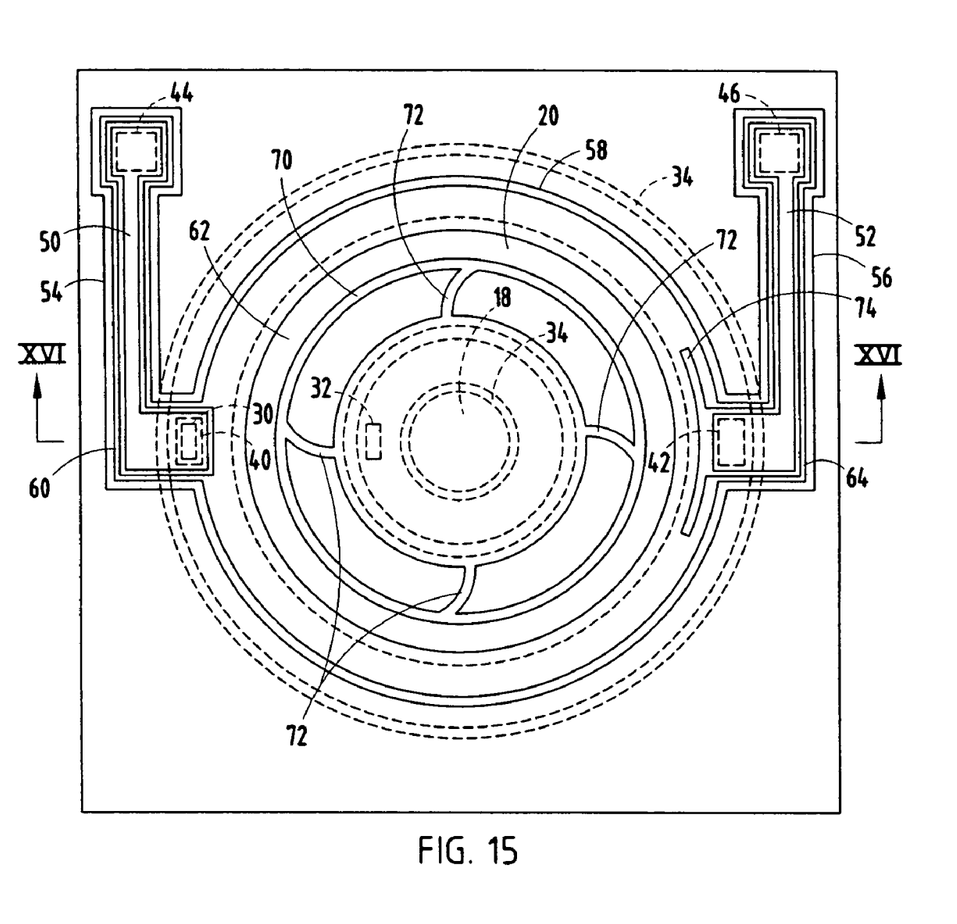
FIG. 15 is a top view of the MEMS device upon completion of the fabrication process.
Figure 16:
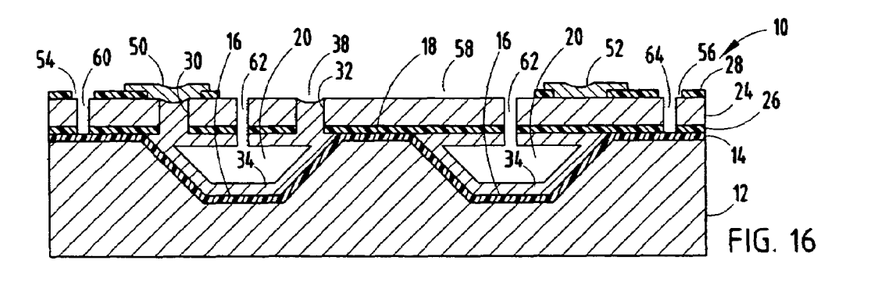
FIG. 16 is a cross-sectional view of the MEMS device taken through lines XVI-XVI of FIG. 15.

Referring to FIGS. 15 and 16, isolation trenches 60, 62 and 64 are formed to delineate and release movable portions of the MEMS device 10 and provide necessary signal isolation among electrical structures. The isolation trenches 60, 62 and 64 may be formed by using masking and etching steps. It should be appreciated that isolation trench 62 extends completely through the device silicon layer 24, oxide layer 26 and the polycrystalline silicon layer 34 formed on the bottom surface of oxide layer 26. Trench 62 isolates movable portions of the device silicon layer from fixed portions, namely the resonating ring 70 and its supporting springs 72 are isolated from the fixed electrode 74. This allows for the ring 70 to resonate and move and provides an isolation gap that further defines a variable capacitor between the ring 70 and fixed electrode 74. Trenches 60 and 64 further isolate the electrical signal path on each of signal lines 50 and 52.

The initial step of the delineation etch may be performed with an etch tool capable of forming high aspect ratio, precision holes in silicon. The tool should also be capable of simultaneously defining the movable portions of the structure by etching to the oxide layer 26 lining the cavity 20, and etching isolation trenches through the device layer 24 down to a buried isolation layer, according to the embodiment shown. Such tools may include a deep reactive ion etch (DRIE) tool. Once the initial delineation etch is complete, a second etch step may be performed to etch the underlying oxide layer 26 to free the micromachined MEMS device 10. It may be desirable to etch the oxide layer with a dry etch, as is known in the art.

Those skilled in the art shall appreciate that combinations and permutations of metal and polycrystalline silicon runners, methods of making contact to the substrate, to the runners, and to the polycrystalline silicon hub contact, polycrystalline silicon oxidations, passivation layers and other common features may be made according to the requirements of the specific MEMS device.

Referring to FIGS. 17-26, a fabrication method of making a subsurface electrical contact on a MEMS device 110 formed on a Silicon-On-Insulator (SOI) substrate is shown according to a second exemplary embodiment. The fabrication and method according to the second embodiment forms a cavity in a single SOI substrate, as opposed to attaching two substrate structures together as illustrated in the first embodiment. The cavity is formed in the structure, and a subsurface electrical signal path is formed in the cavity by deposition of a polycrystalline silicon to form a resultant MEMS device 110 that may be useful for a yaw sensor, an accelerometer or other MEMS device.

Figure 17:
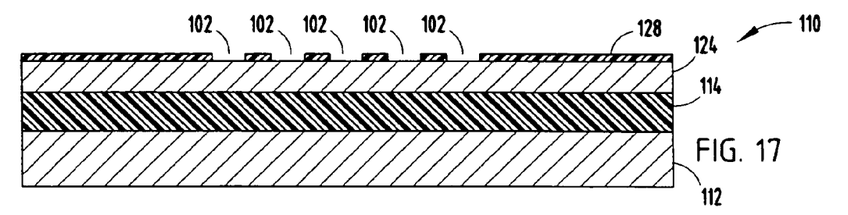
FIG. 17 is a cross-sectional view of a MEMS device during fabrication according to a second embodiment.

The SOI starting material slice is shown comprised of a substrate portion 112 beneath a dielectric layer 114 upon which a semiconducting device layer 124 is formed. Various SOI substrates and methods of forming a SOI starting material slice may be employed. Furthermore, various crystal orientations for the substrate 112 and the device layer 124, as well as doping levels for these layers may be used. According to one exemplary embodiment, the SOI slice may have a P-type<100>silicon substrate layer 112, a dielectric layer 114 made of silicon dioxide, and an epitaxial device layer 124 also made of P-type<100>silicon. The dielectric layer 114 may be approximately 2 µm thick, and the device layer 124 may be approximately 10 to 30 µm thick, according to one exemplary embodiment.

Figure 18:
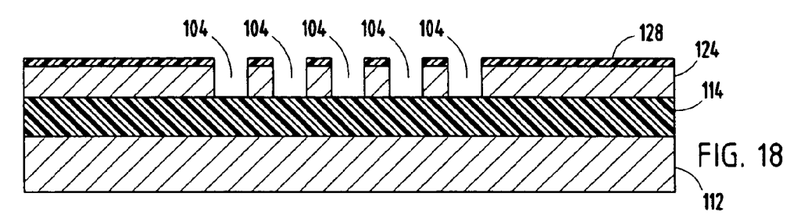
FIG. 18 is a cross-sectional view of the MEMS device further during fabrication according to the second embodiment.
Figure 19:
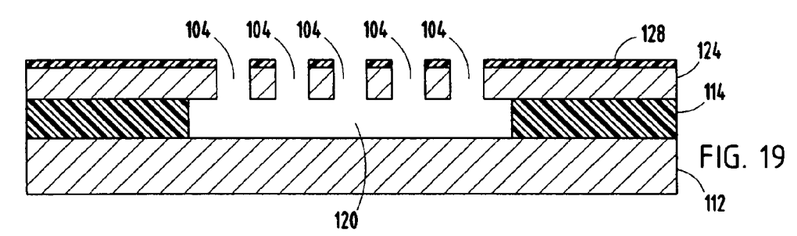
FIG. 19 is a cross-sectional view of the MEMS device further in fabrication of the MEMS device according to the second embodiment.
Figure 20:
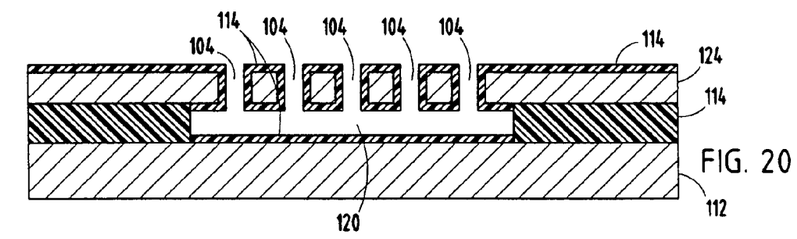
FIG. 20 is a cross-sectional view of the MEMS device further during fabrication according to the second embodiment.

The epitaxial device layer 124 is masked, as is known in the industry, to define a plurality of the holes (vias) 104 through which a polycrystalline silicon will be deposited. The plurality of holes 104 also serve as the access holes for the etchant that will remove the buried oxide 114 to form the cavity 120. Referring to FIG. 17, areas of photoresist layer 128 are initially removed to define the hole locations 102. The masked epitaxial device layer 124 is then etched anisotropically down to the underlying oxide layer 114 as seen in FIG. 18. This may be achieved with a DRIE tool. A portion of the buried oxide layer 114 is then removed as seen in FIG. 19 to define the cavity 120. The photoresist oxide layer 128 is then removed and an oxide layer 114 is grown on the exposed silicon surfaces of device layer 124 and substrate 112, as seen in FIG. 20.

Figure 21:
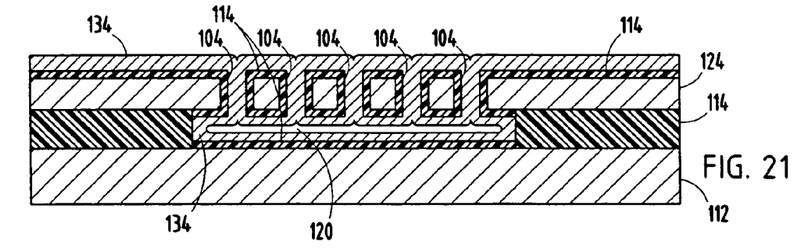
FIG. 21 is a cross-sectional view of the MEMS device further during fabrication according to the second embodiment.

Following deposition of additional oxide layer 114 in cavity 120, polycrystalline silicon 134 is then deposited, as seen in FIG. 21. According to one embodiment, an in-situ doped polycrystalline silicon layer 134 is employed. The polycrystalline silicon 134 is a conformal film, and thus it deposits on all surfaces, inside the cavity 120 as well as on the top surface of the substrate. The polycrystalline silicon layer 134 should be thick enough such that the holes 104 in the epitaxial device layer 124 are completely filled and sealed closed by the polycrystalline silicon 134. Since the cavity 120 under the epitaxial layer 124 is significantly larger than the amount of polycrystalline silicon 134 that is deposited on the walls of the cavity 120 before the holes 104 were filled and thus the polycrystalline silicon 134 stopped being deposited inside the cavity 120, there remains a buried cavity 120 beneath the epitaxial device layer 124. This buried cavity 120 has polycrystalline silicon 134 lining all of its surfaces, and has at least one plug of polycrystalline silicon connecting the top surface with the polycrystalline silicon within the cavity 120. The polycrystalline silicon provides an electrically conductive signal path.

Figure 22:
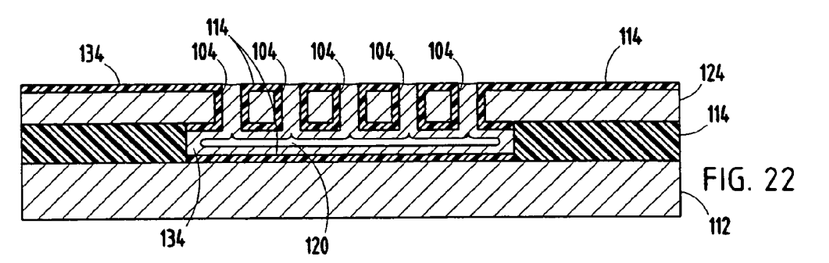
FIG. 22 is a cross-sectional view of the MEMS device further during fabrication according to the second embodiment.

Referring to FIG. 22, an etch back process is then performed to remove the polycrystalline silicon 134 from the top surface of the substrate on top of oxide layer 114. It should be appreciated that a masking step (not shown) performed before the polycrystalline silicon etch back could advantageously pattern the polycrystalline silicon 134 on the top surface, should that be desirable. The exposed polycrystalline silicon surfaces are then passivated. An oxide layer may be formed on top of the polycrystalline silicon 134 by growing or depositing the oxide layer.

Figure 23:
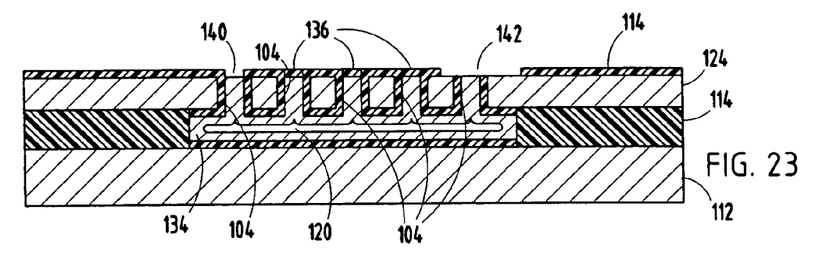
FIG. 23 is a cross-sectional view of the MEMS device further during fabrication according to the second embodiment.
Figure 24:
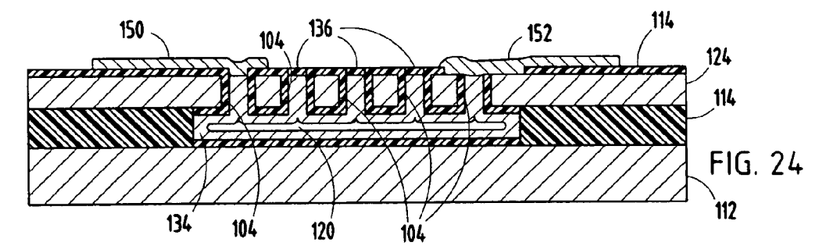
FIG. 24 is a cross-sectional view of the MEMS device further during fabrication according to the second embodiment.
Figure 25:
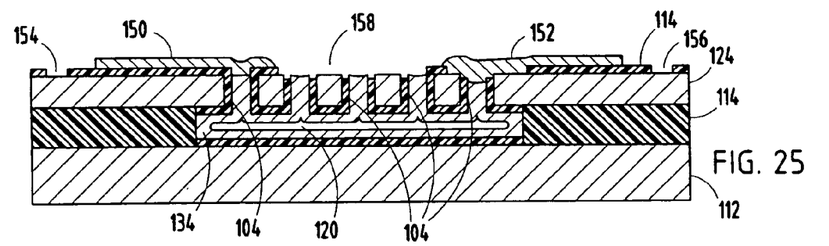
FIG. 25 is a cross-sectional view of the MEMS device further during fabrication according to the second embodiment.
Figure 26:
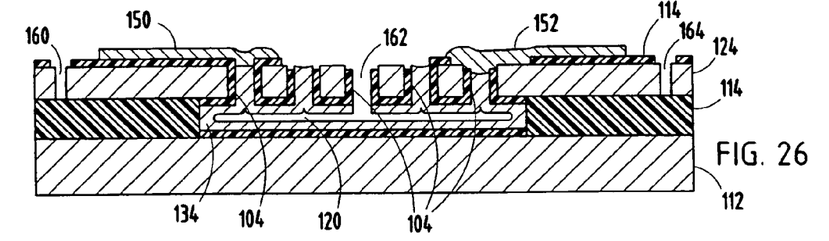
FIG. 26 is a cross-sectional view of the MEMS device further during fabrication according to the second embodiment.

The polycrystalline silicon is passivated, the passivation layer is formed over the exposed surfaces of polysilicon layer 134, including at regions 136, as shown in FIG 23. Contact holes 140 and 142 are formed through the passivation layer(s) 114, as seen in FIG. 23. Metal layers 150 and 152 are then formed and patterned to make electrical contact with the epitaxial device layer 124 and polycrystalline silicon 134, as seen in FIG. 24. A masking step is then performed to pattern the passivation film 114 on top of the epitaxial device layer 124, as seen in FIG. 25, allowing passivation film 114 to be removed in areas 154 and 156 to expose the epitaxial layer 124. The polysilicon layer 134 and epitaxial layer 124 are also exposed in regions 158. This makes the epitaxial device layer 124 available to be etched by a silicon etch. This silicon etch, which may be performed in a DRIE machine, is used to both (1) form isolation trenches 160, 162 and 164 in the epitaxial device layer 124, and (2) to define and release the micromachined structure of the MEMS device 110, as seen in FIG. 26.

Accordingly, the resultant MEMS device 10 or 110 employs a polycrystalline silicon to achieve a subsurface electrical contact for use in transmitting electrical signals. The polycrystalline silicon 34 or 134 is electrically conductive. Additionally, polycrystalline silicon 34 or 134 could be left on top surfaces of the structure, such as the resonating ring and selective springs, to counter the polycrystalline silicon that is deposited on the bottom surfaces of such structures during the conformal deposition step, if desired, to provide a stress balanced micromachined MEMS device 10 or 110. Further, the polycrystalline silicon 34 or 134 can be patterned to form portions of the silicon device layer that have greater heights than adjacent portions of the silicon device layer, such as may be desired for a device using a center hub contact employing interdigitated finger capacitive plates such as for an accelerometer, according to one example.

The polycrystalline silicon 34 or 134 may be doped or undoped and may include any of a number of desired doping types, such as N-type or P-type. Further, the polycrystalline silicon 34 or 134 present on one layer, such as the top surface of the device, could be doped differently from the polycrystalline silicon lining in the cavity. This may be achieved by implanting the surface layer of the polycrystalline silicon so as not to dope the polycrystalline silicon present inside of the cavity.

It should further be appreciated that various MEMS devices may employ the method of fabricating an electrical contact according to the present invention. In particular, it should be appreciated that the method of forming an electrical contact may be employed to contact a center hub or an anchor site for a suspended or cantilevered member, such as may be present on MEMS accelerometer device. The center hub contact may be used to contact any structure suspended or cantilevered from any hub or pedestal rising from a cavity formed in a supporting substrate. Further, multiple rising hubs or pedestals may be formed and may employ the subsurface electrical contact of the present invention. Additionally, the shape and size of the cavity may vary depending upon the desired resultant MEMS device.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. A method of making an electrical contact for a micro-electro-mechanical-systems (MEMS) device, said method comprising the steps of:
   providing a silicon device layer supported on a substrate;
   forming a cavity in the substrate;
   providing a dielectric layer on a surface of the cavity;
   forming at least one via extending through the silicon device layer to allow access to the cavity;
   depositing a layer of polycrystalline silicon (polysilicon) extending into the at least one via and onto the dielectric layer in the cavity;

providing electrical contact to the polysilicon such that electrical signals are able to pass on the polysilicon; and forming a first contact electrically coupled to the polysilicon on a first side of the cavity, and a second contact electrically coupled to the polysilicon on a second side of the cavity.

2. The method as defined in claim 1, wherein the step of providing a silicon device layer supported on a substrate comprises providing a substrate having a recessed cavity formed therein and adhering the silicon device layer on top of the substrate.

3. The method as defined in claim 1, wherein the silicon device layer comprises an epitaxial layer.

4. The method as defined in claim 1, wherein the step of providing a dielectric layer comprises forming an oxide layer on the surface of the cavity.

5. The method as defined in claim 1, wherein the step of depositing polycrystalline silicon layer fills the at least one via.

6. The method as defined in claim 1, wherein the second side comprises a center hub of the device.

7. The method as defined in claim 1, wherein the method is applied to manufacture a MEMS yaw sensor.

8. The method as defined in claim 1, wherein the step of forming an at least one via comprises forming a plurality of vias, and wherein the polycrystalline silicon layer is deposited into each of the plurality of vias.

9. The method as defined in claim 1 further comprising the step of in-situ doping the polycrystalline silicon layer.

* * * * *